United States Patent
Sasaki et al.

(10) Patent No.: US 8,548,401 B2
(45) Date of Patent: Oct. 1, 2013

(54) AMPLIFIER CIRCUIT, CONTROL METHOD FOR SUPPLYING POWER TO AMPLIFIER CIRCUIT, AND TRANSMISSION DEVICE

(75) Inventors: Akio Sasaki, Kawasaki (JP); Setsuya Nagaya, Kawasaki (JP); Narito Matsuno, Kawasaki (JP); Kenji Iwai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 28 days.

(21) Appl. No.: 13/324,544

(22) Filed: Dec. 13, 2011

(65) Prior Publication Data

US 2012/0157020 A1    Jun. 21, 2012

(30) Foreign Application Priority Data

Dec. 16, 2010  (JP) .................................. 2010-281087

(51) Int. Cl.
*H04B 1/04*    (2006.01)

(52) U.S. Cl.
USPC .................. 455/114.2; 455/126; 455/27.1

(58) Field of Classification Search
USPC .............. 455/127.1, 114.2, 114.3, 115.1, 126
See application file for complete search history.

(56) References Cited

U.S. PATENT DOCUMENTS

| 6,625,429 B1 | 9/2003 | Yamashita | |
| 2005/0118965 A1* | 6/2005 | Tanabe et al. | 455/127.1 |
| 2011/0293033 A1* | 12/2011 | Kushnir et al. | 375/295 |

FOREIGN PATENT DOCUMENTS

| JP | 2001-016116 A1 | 1/2001 |
| JP | 2003-008365 A1 | 1/2003 |

* cited by examiner

*Primary Examiner* — Christian Hannon
(74) *Attorney, Agent, or Firm* — Fujitsu Patent Center

(57) ABSTRACT

An amplifier circuit includes an amplifier, a detecting unit which detects a power output from the amplifier, a control unit which controls a saturation point of the amplifier with respect to a Peak-to-Average Power Ratio (PAPR) obtained by a detection output of the detecting unit.

7 Claims, 22 Drawing Sheets

AMPLIFIER CIRCUIT, CONTROL METHOD FOR SUPPLYING POWER TO AMPLIFIER CIRCUIT, AND TRANSMISSION DEVICE

CROSS-REFERENCE TO RELATED APPLICATIONS

This application is based upon and claims the benefit of priority from the prior Japanese Patent Application No. 2010-281087 filed on Dec. 16, 2010, the entire contents of which are incorporated herein by reference.

FIELD

The embodiments discussed herein are related to a control technique of an amplifier for amplifying a transmission power and the like.

BACKGROUND

A transmission device, which performs radio communication of voice information and data of a mobile phone and the like, performs power amplification on a transmission signal to be output. To determine whether or not a prescribed output is output with respect to the transmission signal, the transmission device includes a detecting unit to monitor the output. If the transmission device does not obtain a desired output, the transmission device controls an output power according to a detection result.

For example, Japanese Laid-open Patent Publication No. 2003-8365 discloses a method for monitoring and controlling the power amplification. Japanese Laid-open Patent Publication No. 2003-8365 discloses that a direction coupler receives a signal according to the output signal output to an antenna side from one terminal, receives a reflection wave from the antenna side, and outputs the signal according to the reflection wave and that a detector detects the signal output. The control circuit described in Japanese Laid-open Patent Publication No. 2003-8365 may control the output voltage of a DC/DC converter based on a detection result.

For example, Japanese Laid-open Patent Publication No. 2001-16116 discloses a method for controlling the amplification of a transmission output by the power amplifier. Japanese Laid-open Patent Publication No. 2001-16116 discloses a first detecting unit that detects the transmission signal with a first detection sensitivity and discloses a second detecting unit that detects the transmission signal with a second detection sensitivity that is lower than the first detection sensitivity. Japanese Laid-open Patent Publication No. 2001-16116 controls the dynamic range of the amplifier by comparing the synthesized signal resulted in synthesis of the detected output signal to a transmission lamp generating signal.

As a high-speed communication standard of radio communication, High Speed Downlink Packet Access (HSDPA) and High Speed Uplink Packet Access (HSUPA) desire the transmission signal of which a large Peak-to-Average Power Ratio (PAPR) with respect to voice communication or constant speed packet communication (3GPP R99). That is, in the above-described communication standard, the transmission device is desired to handle a signal of which the rate of a peak power with respect to an average power is high. Regarding Long Term Evolution (LTE) or the like that is to be put to practical use in the future, for example, the modulation bandwidth of the transmission signal apparently varies up to 100 times at the maximum, so that the wider the bandwidth, the more the PAPR is increased.

Regarding the signal of which the PAPR is increased, if the electronic character of the transmission circuit is constant, the performance of Adjacent Channel Leakage power Ratio (ACLR) or Spectrum Emission Mask (SEM) specified in 3GPP is deteriorated compared to a case of handling the signal of the conventional constant speed packet communication standard (for example, R99). Therefore, comparing to the case of handling the conventional R99 communication signal, when using the signal such as the HSDPA, the HSUPA, and the LTE, the mobile communication terminal is desired to have a high saturation characteristic in the transmission circuit to achieve the appropriate performance according to the signal. In particular, a Power AMP (PA) of the transmission circuit of which the drive voltage is increased to raise the saturation point is provided to a market to correspond to the signal characteristic to be used.

Actually, however, if the PA drive voltage is increased, a communication time of a mobile communication terminal is shortened when current consumption is increased. Therefore, for example, the voltage is varied according to the type of the signal that is currently being transmitted or the control is performed to reduce the voltage when the transmission power is low.

The control is performed to change the PA drive voltage in such a way that the ACLR character is not deteriorated when the PA drive voltage is reduced and the transmission power is low or the PAPR of the transmission signal is different and the transmission signal type is different. The above-described control is performed by depending on the output power level that is set in advance and the transmission signal type such as the HSDPA, the HSUPA, the LTE, and the like.

The PAPRs are different from each other depending on a signal condition even if the signal types are similar. Regarding the voltage control of the PA according to the conventional transmission signal, for example, the drive voltage of the PA is set according to the theoretical maximum PAPR to correspond to all the PAPRs. As a result, there are many cases in which the voltage is increased more than necessary for the operation with respect to the PAPR of the signal that is actually being transmitted. Thus, there is a problem that the communication time is shortened as the power consumption is increased. The ACLR, the SEM, and the like specified by 3GPP are strongly correlated with the PAPR of the transmission signal. Therefore, for example, there is a method for controlling the drive voltage of the PA according to the signal PAPR that is being transmitted, so that the drive voltage is optimum most of the time if not always and a method of envelope tracking by varying the drive voltage of the PA according to a state of the transmission signal. However, when a large calculation circuit is desired, followability with respect to the modulated signal in a broadband such as the LTE is desired to be improved.

In general, the transmission circuit includes a nonlinearity of the PA in an area where the transmission power is high and includes a control function for correcting an output power error caused by a gain change due to a temperature variation or the like. For example, part of the output of the PA is extracted by a coupler, and the effective value of the output power is detected by a diode detector. The power that is actually being transmitted is measured based on the detected result, so that an error between the power and the target transmission power is corrected.

Japanese Laid-open Patent Publication No. 2003-8365 and Japanese Laid-open Patent Publication No. 2001-16116 do not have the disclosure or the suggestion of the above-described requirement and problem.

SUMMARY

According to an aspect of the invention, an amplifier circuit includes an amplifier, a detecting unit which detects a power output from the amplifier, a control unit which controls a saturation point of the amplifier with respect to a Peak-to-Average Power Ratio (PAPR) obtained by a detection output of the detecting unit.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

[First Embodiment]

Figure 1:
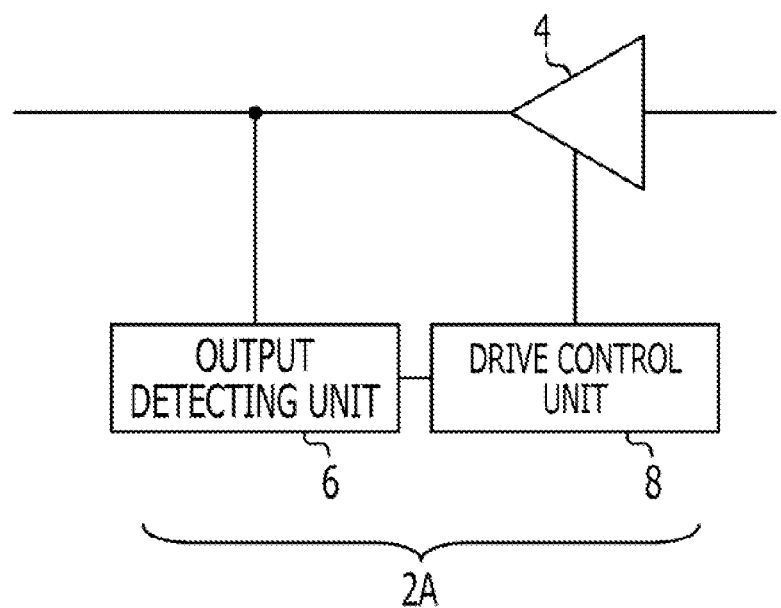
FIG. 1 is a diagram illustrating a configuration example of an amplifier circuit according to a first embodiment.

A first embodiment will be described with reference to FIG. 1. FIG. 1 is a diagram of a configuration example of an amplifier circuit according to the first embodiment. The configuration illustrated in FIG. 1 is an example, and the present embodiment is not limited to this example.

An amplifier circuit 2A illustrated in FIG. 1 is an example of the disclosed amplifier circuit and transmission device and amplifies the signal to be output from the transmission device up to a prescribed power. The signal that is subjected to amplification processing is used as, for example, a high frequency signal such as a voice signal and a data signal. The amplifier circuit 2A includes, for example, an amplifier 4, an output detecting unit 6, and a drive control unit 8.

The amplifier 4 is an example of a unit that amplifies, for example, a high frequency signal or the like obtained by modulating a voice signal or a data signal as the input signal up to a prescribed power (transmission power). For example, the amplifier 4 may change the saturation point by increasing or decreasing the drive voltage, and the control may be performed so that the drive voltage is optimum with respect to the PAPR of the signal to be amplified.

The output detecting unit 6 is an example of the unit for detecting an output power of the amplified signal. For example, the output detecting unit 6 may include a detection circuit such as a diode detector. The output detecting unit 6 extracts part of the signal by, for example, a detecting unit such as a coupler, which is provided on the output side of the amplifier 4, and performs power detection to monitor the amplification performed by the amplifier 4. For example, the power detection is performed to detect a peak power or an average power to calculate the PAPR of the amplified signal. The detected output power is transmitted to the drive control unit 8.

For example, the drive control unit 8 calculates the PAPR based on the output power detected by the output detecting unit 6 and performs the operation control of the amplifier 4 in such a way that the saturation point of the amplifier 4 is optimum with respect to the PAPR. To calculate the PAPR, for example, the peak power and the average power of the signal detected by the output detecting unit 6 are used to calculate a ratio of the values, that is, the PAPR. Regarding the calculated PAPR, the drive control unit 8 determines whether or not the optimum power is supplied to the amplifier 4 and then controls the drive voltage with respect to the amplifier 4.

Figure 2:
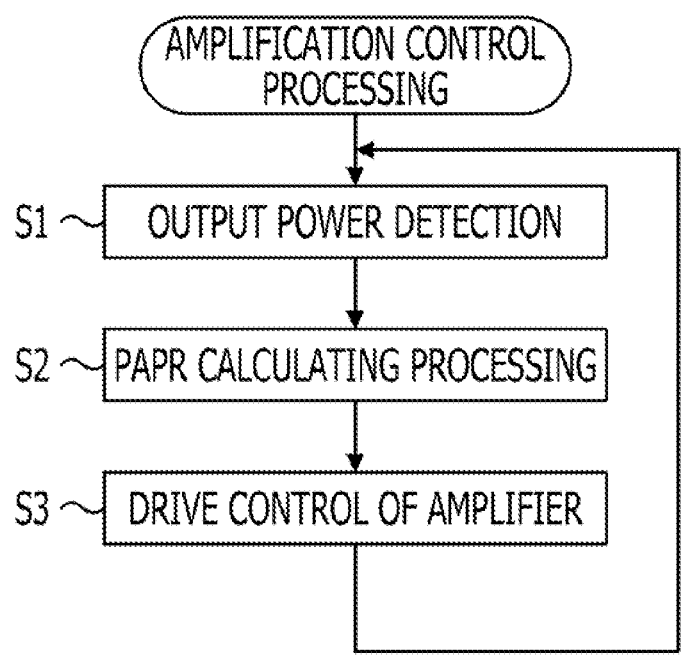
FIG. 2 is a flowchart illustrating an example of amplification control processing.

The amplification control processing will be described with reference to FIG. 2. FIG. 2 is a flowchart illustrating an example of the amplification control processing. The processing content, the processing procedure, and the like illustrated in FIG. 2 are examples, and the present embodiment is not limited to the examples.

The amplification control processing is an example of a method for supplying power to the disclosed amplifier circuit. If the input signal is amplified with a prescribed drive voltage by the amplifier 4 and is then output, the output detecting unit 6 detects the output power of the output signal (Operation S1).

The drive control unit 8 calculates the PAPR of the signal that is output by using the detected output power value (Operation S2).

Based on the PAPR obtained by the detection output, the drive control unit 8 performs drive control of the amplifier 4 (Operation S3).

In the first embodiment, by performing the drive control of the amplifier based on the PAPR desired by the detection output, the saturation characteristic of the amplifier may be varied, and the optimum power supply may be controlled regardless of the signal type. In the first embodiment, the optimization of the power supply prevents the ACLR characteristic of the signal from being deteriorated, so that the usage time of communication of a mobile terminal device and the like may be extended.

[Second Embodiment]

Figure 3:
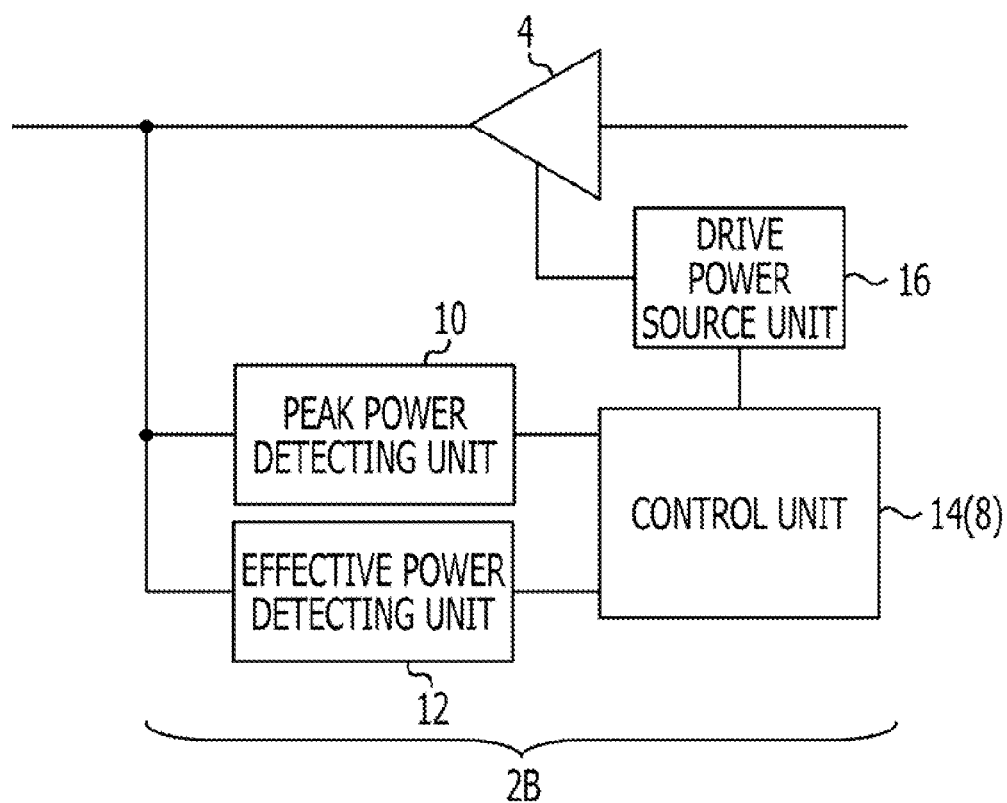
FIG. 3 is a diagram illustrating a configuration example of an amplifier circuit according to a second embodiment.

A second embodiment will be described with reference to FIG. 3. FIG. 3 is a diagram illustrating a configuration example of an amplifier circuit according to the second embodiment. The configuration illustrated in FIG. 3 is an example, and the present embodiment is not limited to the example.

An amplifier circuit 2B, which is an example of the disclosed amplifier circuit and the transmission device, may include, for example, a peak power detecting unit 10 and an effective power detecting unit 12 illustrated in FIG. 3 as an output detecting unit that monitors amplification processing of the amplifier 4. The amplifier circuit 2B includes a control unit 14 and a drive power source unit 16. For example, the amplifier circuit 2B obtains the PAPR based on the peak power and the effective power detected from the output signal and controls the drive voltage to the amplifier 4 based on the PAPR.

The peak power detecting unit 10 is an example of a second detecting unit that detects the peak power of the signal output from the amplifier 4. The peak power detecting unit 10 includes, for example, a diode detection circuit with a peak holding characteristic. The peak power detecting unit 10 detects a peak power of the signal output from the amplifier 4. In the detecting processing, for example, the detected value that is close to the peak holding character of the amplified output signal is obtained. Thus, the peak power value may be obtained by performing smoothing processing on the detected value.

The effective power detecting unit 12 is an example of a first detecting unit that detects the effective power output from the amplifier 4. For example, the effective power detecting unit 12 includes a diode detection circuit that detects the effective power. The effective power detecting unit 12 detects the effective power value, the effective voltage value, and the like of the signal output from the amplifier 4. In the effective power detection, for example, envelope detection of the amplified signal is performed, and the effective output power is obtained by performing the smoothing processing on the detected value.

The peak power detected by the peak power detecting unit 10 and the effective power detected by the effective power detecting unit 12 are transmitted to the control unit 14.

The control unit 14 is an example of the unit for performing the drive control of the amplifier 4 by using the detection result from the peak power detecting unit 10 and the effective power detecting unit 12. The control unit 14 calculates, for example, the difference value between the detected peak power and the detected effective power, that is, the PAPR. The control unit 14 outputs a control instruction to the drive power source unit 16 so that the saturation point of the amplifier 4 is the optimum value based on the PAPR. In the control, for example, a table, a calculation formula, and the like in which the PAPR is correlated with the difference value between the peak power and the effective power, and the table and the calculation formula in which the optimum drive voltage corresponding to the PAPR is correlated are used. Alternatively, the table and the calculation formula in which the optimum drive voltage is correlated based on a combination of the peak power and the effective power may be used. As a result, the optimum drive voltage with respect to the amplifier 4 corresponding to the PAPR of the transmission signal may be obtained.

The drive power source unit 16 is an example of an applying unit of a drain voltage as the drive voltage with respect to the amplifier 4 and may change the saturation point of the amplifier 4 according to an applied voltage of the drive power source unit 16.

Figure 4:
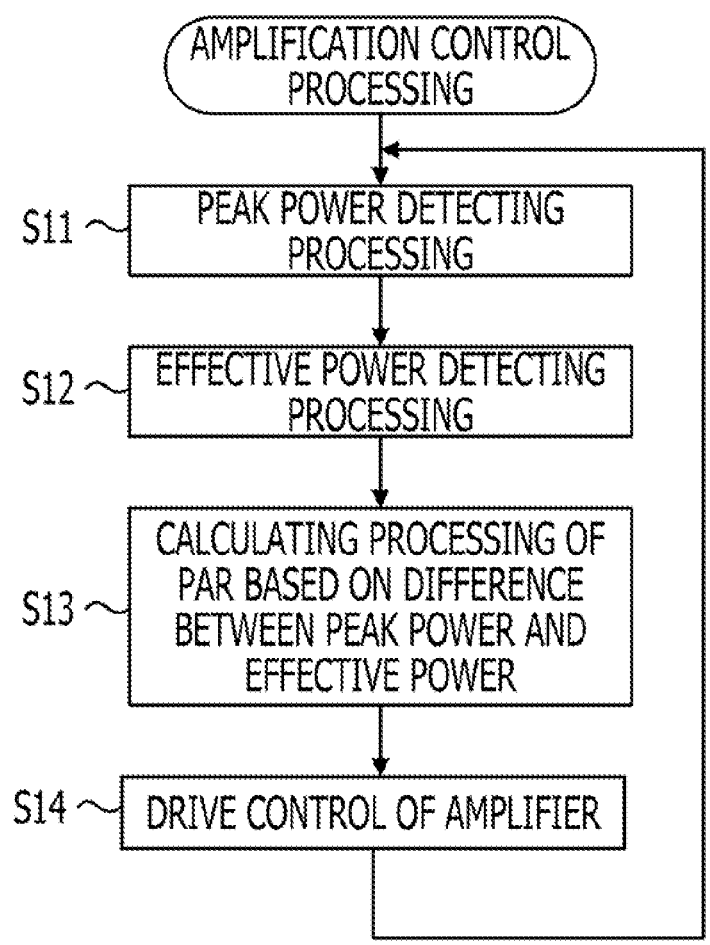
FIG. 4 is a flowchart illustrating another example of the amplification control processing.

The amplification control processing will be described with reference to FIG. 4. FIG. 4 is a flowchart illustrating an example of the amplification control processing. The processing content, the processing procedure, and the like illustrated in FIG. 4 are examples, and the present embodiment is not limited to the examples.

The amplification control processing is an example of the control method for supplying the power to the disclosed amplifier circuit. According to the control method, the output signal amplified by the amplifier 4 is detected, the peak power and the effective power are detected, and the difference value between the peak power and the effective power is obtained. The drive control of the amplifier 4 is performed so that the saturation point of the amplifier 4 is optimum based on the difference value.

The peak power detecting unit 10 detects the peak power from the amplified output signal (Operation S11). The effective power detecting unit 12 detects the effective power (Operation S12). The control unit 14 calculates the difference between the detected peak power and the detected effective power and obtains the PAPR based on the calculated value (Operation S13). The processing will be described with reference to a table in which the difference value of the power is correlated with the PAPR.

The control unit 8 performs the drive control of the amplifier 4 in such a way that the saturation point of the amplifier 4 is the optimum value with respect to the desired PAPR (Operation S14). In the drive control, based on the control instruction from the control unit 8, the drive power source unit 16 increases or reduces the drive voltage that is applied to the amplifier 4.

According to the second embodiment, regarding the amplified output signal, the PAPR may be obtained based on the peak power value and the effective power value. The drive control of the amplifier is performed in such a way that the saturation point of the amplifier 4 is the optimum value with respect to the PAPR. This may prevent the ACLR characteristic of the signal from being deteriorated. The amplifier circuit measures the PAPR of the signal, and the drive control of the amplifier is performed based on the PAPR. Accordingly, the optimum power supply may be controlled regardless of the signal type. Due to the optimization of the power supply, the usage time of communication of a mobile terminal device or the like may be extended.

[Third Embodiment]

Figure 5:
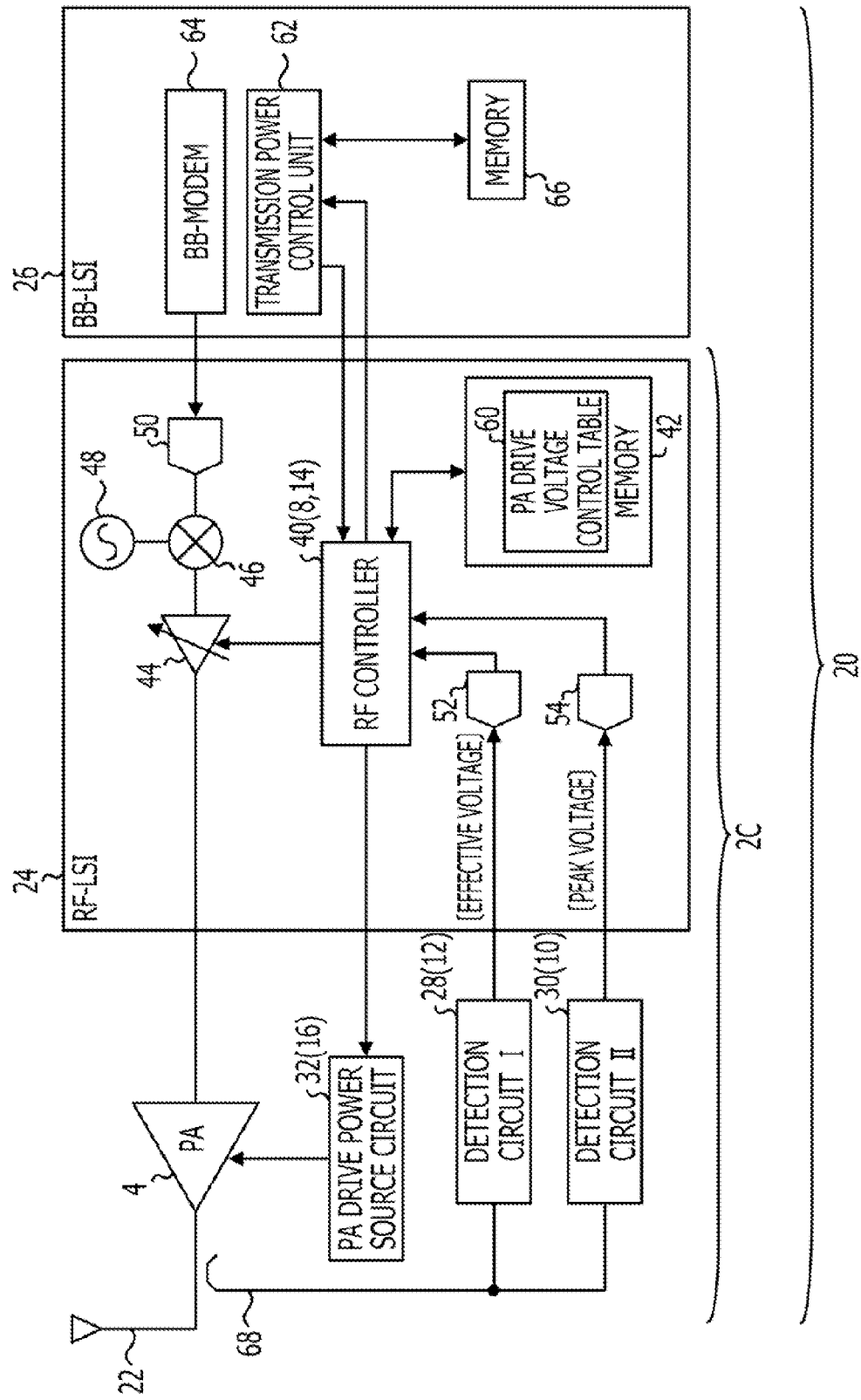
FIG. 5 is a diagram illustrating a configuration example of a transmission device according to a third embodiment.

A third embodiment will be described with reference to FIG. 5. FIG. 5 is a diagram illustrating a configuration example of a transmission device according to the third embodiment. The configuration illustrated in FIG. 5 is an example, and the present embodiment is not limited to the example.

A transmission device 20 is an example of the disclosed transmission device and transmits a voice signal, a data signal, and the like through radio communication. As described above, the transmission device 20 includes the amplifier 4 and an antenna 22 to obtain the transmission power. The transmission device 20 includes, for example, a mobile phone, a Personal Computer (PC), and an apparatus such as a radio that may perform the radio communication. The antenna 22 receives the supply of the transmission power from the amplifier 4 and emits the transmission signal (radio signal) toward a radio communication base station and other radio communication apparatuses.

The transmission device 20 includes a Radio Frequency-Large Scale Integration circuit (RF-LSI) 24, a Base Band LSI (BB-LSI) 26 that performs processing on the transmission signal and various communication control processing, a detection circuit I 28, a detection circuit II 30, a PA drive power source circuit 32, a PA (amplifier) 4, and the like.

The RF-LSI 24 is an example of the communication control unit of the transmission device and is configured to perform the power control on the transmission signal, the drive voltage control on the above-described amplifier 4, and the like. The RF-LSI 24 includes, for example, an RF controller 40, and a memory 42. Furthermore, as a control function unit with respect to the transmission signal, the RF-LSI 24 includes, for example, a variable gain amplifier 44, a mixer 46, and a carrier wave oscillator 48.

The RF controller 40 is a unit that performs the drive control of the amplifier and is an example of the power control unit with respect to the transmission signal. For example, the RF controller 40 corresponds to the above-described drive control unit 8 (FIG. 1) and the control unit 14 (FIG. 3). For example, the RF controller 40 is coupled to the detection circuit I 28 and the detection circuit II 30. As described above, as the drive voltage control of the amplifier 4, the control instruction is output to the PA drive power source circuit 32 based on the detection result. For example, the RF controller 40 is coupled to a transmission power control unit 62 of the BB-LSI 26 to receive and transmit the detection information and the control information of the transmission signal. As for the power control performed on the transmission signal, the RF controller 40 outputs the control instruction to the variable gain amplifier 44. In the power control, for example, based on the value instructed by the transmission power control unit 62, the RF controller 40 calculates the gain, which is to be amplified by the amplifier 4, and the drive voltage. The calculation is set to the transmission signal in such a way that the amplifier 4 is not saturated.

The memory 42 is an example of a unit that stores the communication control information and the like and includes, for example, a PA drive voltage control table 60 that stores the drive voltage control information with respect to the PAPR correlated with the detection information and to the amplifier 4. In the drive voltage control, for example, by using the PA drive voltage control table 60, the RF controller 40 determines the drive voltage in such a way that the saturation point of the PA is the optimum value with respect to the PAPR of the transmission signal.

The variable gain amplifier 44, which is an example of the output power unit with respect to the transmission signal, amplifies the transmission signal up to a prescribed power value. The variable gain amplifier 44 may set a gain of the power value. For example, in the power control with respect to the transmission signal, the variable gain amplifier receives the power control instruction from the RF controller 40 based on the control instruction and the detection result from the BB-LSI 26.

The mixer 46 is an example of a modulating unit that put the signal to be transmitted on a carrier wave. That is, the mixer 46 modulates the transmission signal by adding the carrier wave from the carrier wave oscillator 48 to the transmission signal received from the BB-MODEM 64 of the BB-LSI 26.

The detection circuit I 28 is an example of the above-described effective power detecting unit 12. For example, the detection circuit I 28 detects the effective power value from the transmission signal extracted from the output side of the amplifier 4 by the coupler 68 and converts the effective power value into the direct voltage. The converted effective voltage value (Vrms) is converted by an A/D converter 52 and is then input into the RF controller 40.

The detection circuit II 30 is an example of the above-described peak power detecting unit 10 and detects the peak voltage value (Vpk) from the transmission signal extracted from the output side of the amplifier 4 by the coupler 68. The converted peak voltage value (Vpk) is converted by an A/D converter 54 and is then input into the RF controller 40.

After performing the smoothing processing on each of the input detected values, the RF controller 40 calculates the difference value (Vdiff) between the peak voltage value (Vpk) and the effective voltage value (Vrms). Regarding the smoothing processing of the detected value, for example, the detected value may be averaged by sampling and calculating the detection value. Alternatively, before the detected value is input into the A/D converter 52, a low pass filter may be provided. The calculated difference value (Vdiff) is a value that is correlated with the PAPR of the transmission signal.

The RF controller 40 performs Auto Power Control (APC) on an error of the output power caused by a change of the gain or the like from the nonlinearity or temperature variation of the amplifier 4 in an area where the transmission power is high. In the APC, based on the effective voltage value (Vrm) extracted from the detection circuit I 28, for example, the RF controller 40 calculates the power that is currently being transmitted and performs the transmission power control if the power value does not match the set transmission power value. In this case, the RF controller 40 outputs the transmission power control information to the variable gain amplifier 44.

The PA drive power source circuit 32 is an example of the above-described drive power source unit 16 and applies the drive voltage to the amplifier 4 based on the drive control from the RF controller 40.

The BB-LSI 26 is an example of the information processing unit that processes the voice signal, the data signal, and the like to be transmitted. The BB-LSI includes, for example, the transmission power control unit 62, a BB-MODEM 64, a memory 66, and the like.

The transmission power control unit 62, which is an example of the power control unit according to the communication control among the radio communication base station and other radio communication apparatuses and to the transmission signal, receives and transmits the control information. The control information includes, for example, the transmission power value, the PAPR set with respect to the transmission signal, and other information. For example, the control information is stored in the memory 66.

The BB-MODEM 64 is an example of the unit that performs digital signal modulating processing on the voice or the data used by the transmission device 20. The transmission signal modulated by the BB-MODEM 64 is input into the RF-LSI 24 and is then modulated into a carrier wave by the mixer 46 through a D/A converter 50.

The memory 66 is an example of a storage unit and stores, for example, the transmission power control information such as the PAPR that is set according to the type of the signal to be transmitted.

Figure 6:
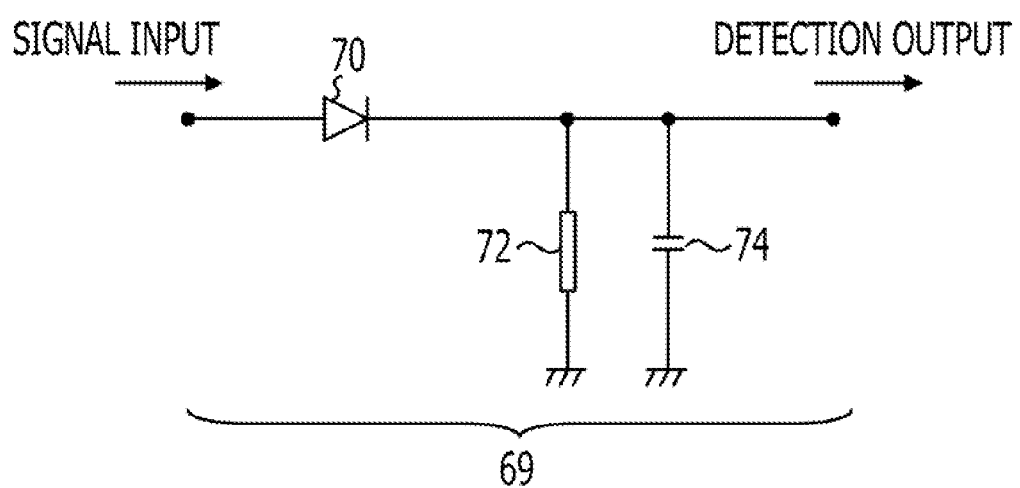
FIG. 6 is a diagram illustrating a configuration example of a detector.
Figure 7:
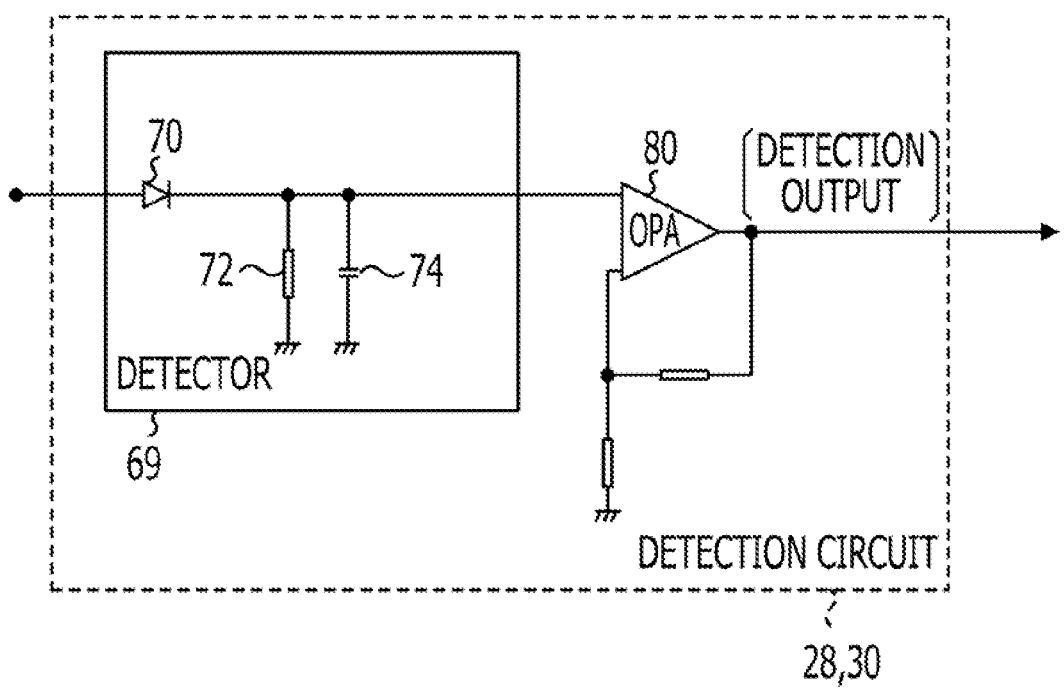
FIG. 7 is a diagram illustrating a configuration example of a detection circuit.
Figure 8A:
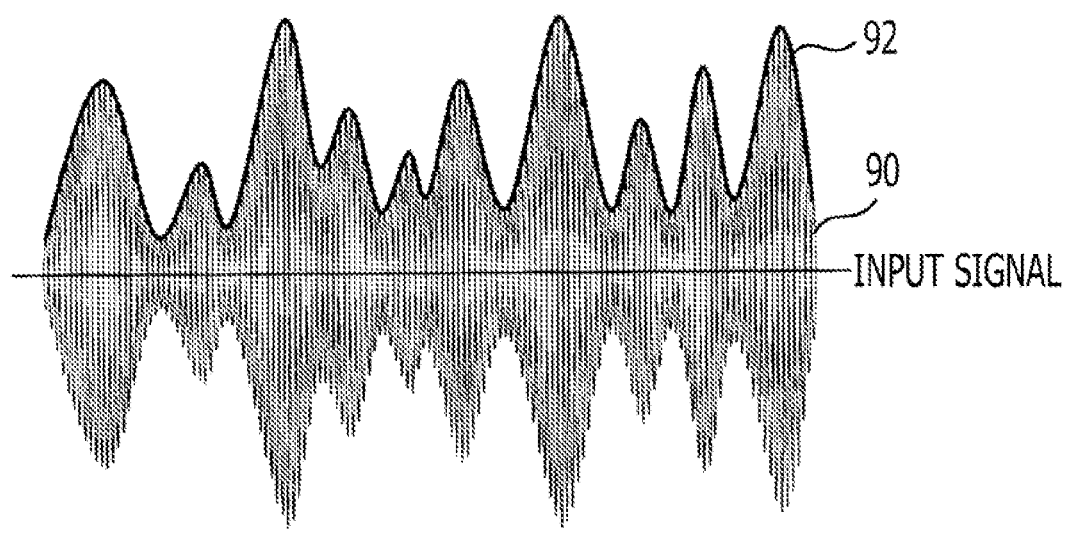
FIGS. 8A and 8B are diagrams illustrating an example of envelope-detection of an input signal.
Figure 8B:
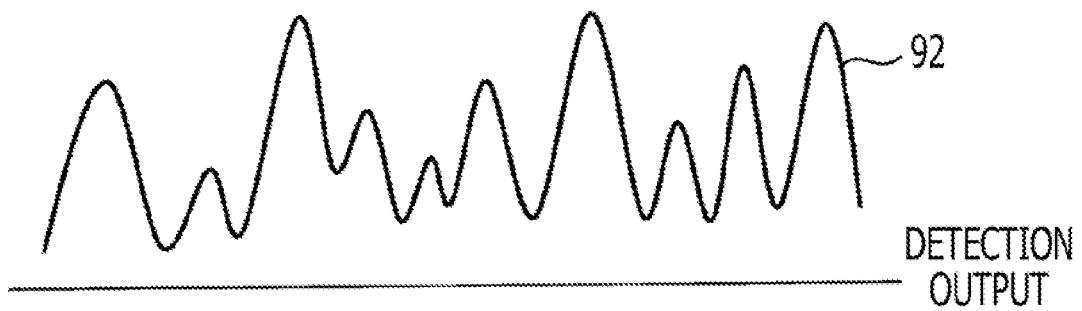
Figure 9A:
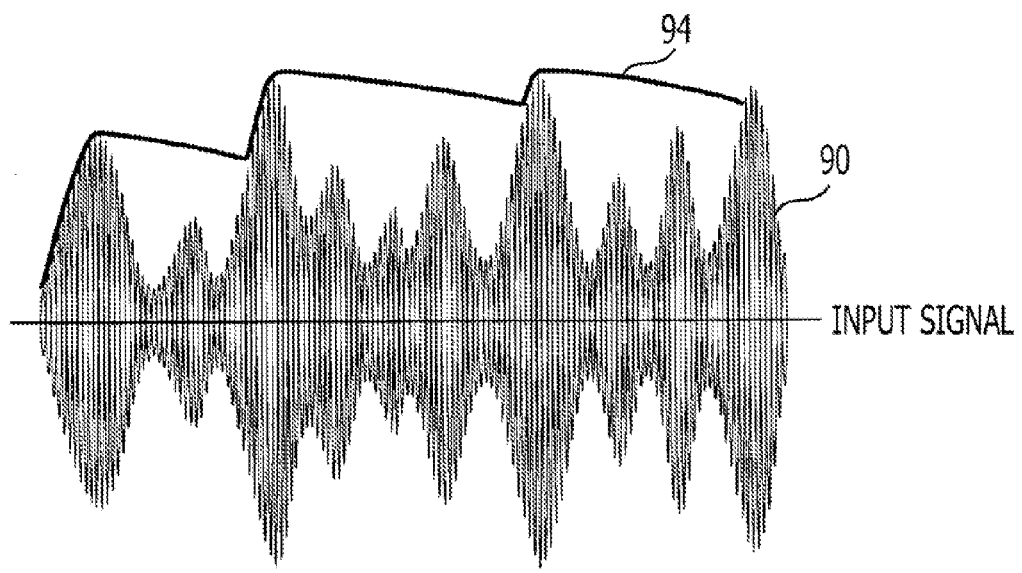
FIGS. 9A and 9B are diagrams illustrating an example of a detection output of a peak holding characteristic of the input signal.
Figure 9B:
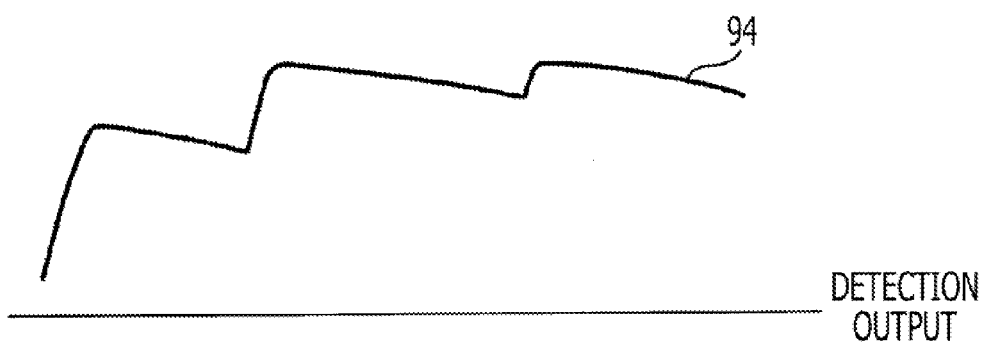
Figure 10:
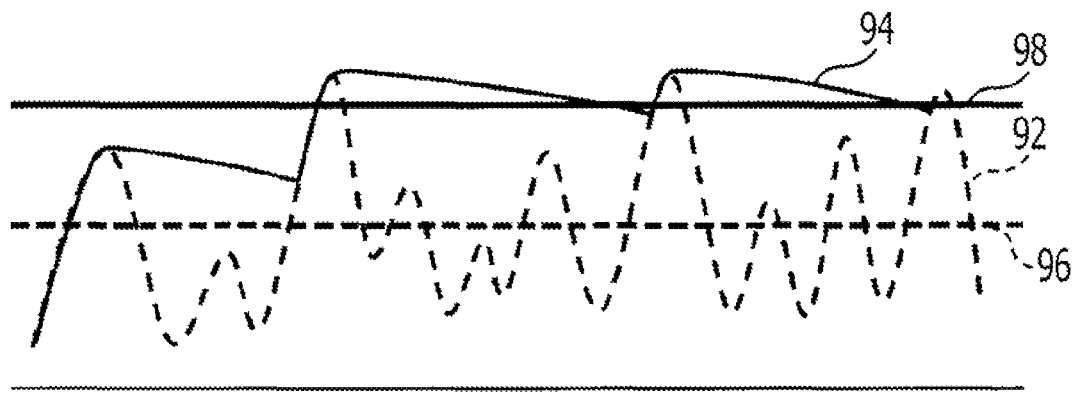
FIG. 10 is a diagram illustrating an example of an envelope-detection output and a peak holding characteristic detection output.

The configuration example of the detecting unit of the transmission signal will be described with reference to FIGS. 6, 7, 8A, 8B, 9A, 9B, and 10. FIG. 6 is a diagram illustrating a configuration example of the detector. FIG. 7 is a diagram illustrating a configuration example of the detection circuit. FIGS. 8A and 8B are diagrams illustrating an example of envelope detection of the input signal. FIGS. 9A and 9B are diagrams illustrating an example of a detection output of the peak holding characteristic of the input signal. FIG. 10 is a diagram illustrating an example of the envelope detection output and the peak holding characteristic detection output. The configuration illustrated in FIG. 6 and FIG. 10 is an example, and the present embodiment is not limited to the example.

A detector 69 illustrated in FIG. 6 is an example of the disclosed detection circuit. The detector 69 may use a diode detector that uses, for example, a diode 70, a resistance R 72, and a condenser C 74. With respect to the detector 69, the transmission signal extracted by the coupler 68 (FIG. 5) is transmitted through the diode 70, and the output flows into the resistance R 72 and the condenser C 74. If the time constant of the resistance R 72 and the condenser C 74 is set optimum, an envelope detection 92 with respect to a waveform 90 of the transmission signal is obtained as illustrated in FIG. 8A. By smoothing the output signal, as illustrated in FIG. 8B, the effective voltage value that is proportional to the effective value may be extracted.

For example, if the value of the resistance R 72 is set high, the detection output may not follow the envelope. When the diagonal clipping distortion is generated, as illustrated in FIG. 9A, a peak holding detection 94 may be obtained with respect to the waveform 90. As a result, as illustrated in FIG. 9B, the peak voltage value that is proportional to the peak power may be extracted.

As illustrated in FIG. 7, the detection circuits 28 and 30 may include, for example, an OPA 80, which detects the prescribed effective voltage value and the peak voltage value, as well as the detector 69.

Figure 11:
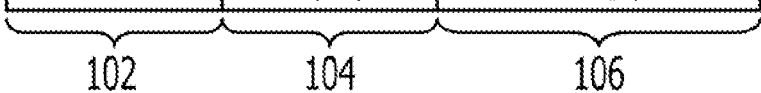
FIG. 11 is a diagram illustrating an example of a PA drive voltage control table.

As described above, the smoothing processing is performed on the detection output obtained by the detection circuits 28 and 30, respectively. Regarding the detection output result illustrated in FIG. 10, if each detection output is converted into a constant level by the smoothing processing, different values are obtained in the envelope detection and the peak holding characteristic detection. According to the detection result, if the PAPR of the modulated transmission signal is high, a peak voltage 98 subjected to the smoothing processing is high. As a result, the difference between the peak voltage and an effective voltage 96 obtained by the envelope detection 92 after the smoothing processing is large. The transmission device 20 measures the PAPR of the modulated wave by correlating the calculated difference value with the actual PAPR. For example, the transmission device 20 previously obtains the correlation of the difference of the detection value and the PAPR and obtains the correlation of the PAPR and the drive voltage value of the amplifier 4. The transmission device 20 sets the PA drive voltage control table 60 as illustrated in FIG. 11.

The drive control table of the amplifier will be described with reference to FIG. 11. FIG. 11 is a diagram illustrating an example of the PA drive voltage control table. The configuration illustrated in FIG. 11 is an example, and the present embodiment is not limited to the example.

The PA drive voltage control table 60 is stored in, for example, the memory 42 of the transmission device 20. The PAPR 104 and the PA drive voltage 106 in at state are set with respect to the difference value (Vdiff) between the peak voltage value and the effective voltage value detected by the transmission signal detection. For example, the PA drive voltage 106 sets a value that prevents the Adjacent Channel Leakage power Ratio (ACLR) with respect to the corresponding PAPR 104 from being deteriorated.

Figure 12:
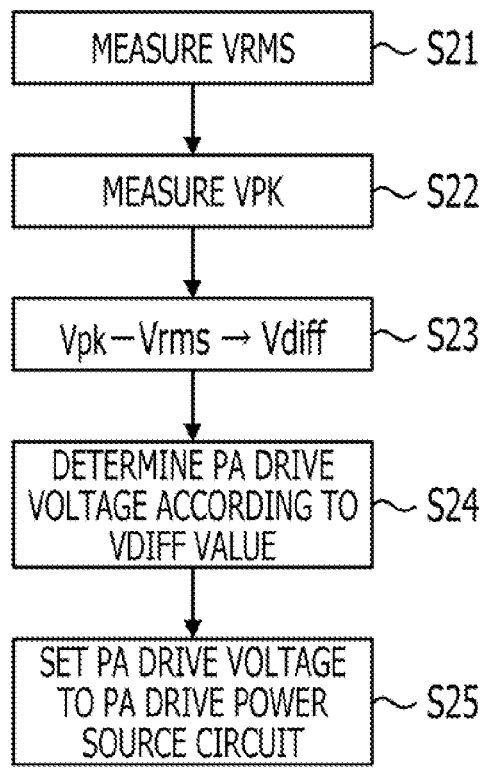
FIG. 12 is a flowchart illustrating another example of the amplification control processing.
Figure 13:
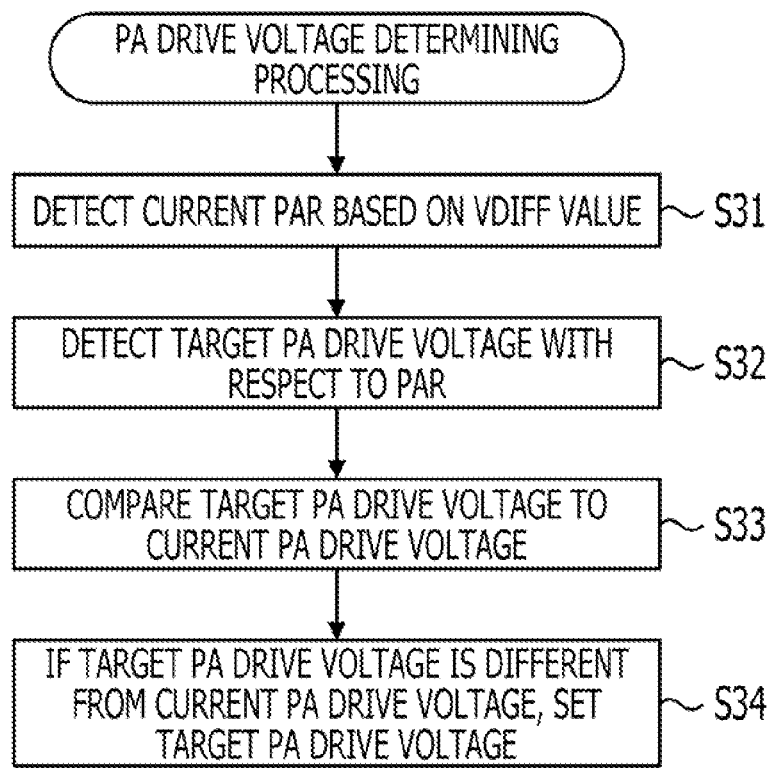
FIG. 13 is a flowchart illustrating an example of PA drive voltage determining processing.

The amplification control processing will be described with reference to FIG. 12 and FIG. 13. FIG. 12 is a flowchart illustrating an example of the amplification control processing. FIG. 13 is a flowchart illustrating an example of the PA drive voltage determining processing. The processing content, the processing procedure, and the like illustrated in FIG. 12 and FIG. 13 are examples, and the present embodiment is not limited to the examples.

The amplification control processing is an example of the control method for supplying power to the disclosed amplifier circuit. According to the amplification control processing, for example, the drive voltage of the amplifier is controlled in such a way that the saturation point of the amplifier is the optimum value based on the difference between the effective voltage value and the peak voltage value output from the amplifier.

The effective voltage value Vrms (root mean square) is measured from the transmission signal (Operation S21). The effective voltage value Vrms is measured by using the detection circuit I 28, performing the envelope detection on the detection output, and performing the smoothing processing on the detection value. On the other hand, the peak voltage value Vpk is measured from the transmission signal (Operation S22). In the measurement of the peak voltage value Vpk, with respect to the transmission signal, the voltage value indicating the peak holding characteristic in response to the input signal is detected by using the detection circuit II 30. The peak voltage value Vpk is measured by performing the smoothing processing on the detection output.

In response to the result from the voltage measurement, the RF controller 40 calculates the difference Vdiff between the peak voltage value Vpk and the effective voltage value Vrms (Operation S23). As illustrated in FIG. 10, the calculated difference value Vdiff indicates the difference between the peak voltage 98 and the effective voltage 96, and the difference value is correlated with the PAPR.

Regarding the calculated difference value Vdiff, for example, with reference to the PA drive voltage control table 60 illustrated in FIG. 11, the RF controller 40 determines the PA drive voltage value where the saturation point of the amplifier 4 is the optimum value (Operation S24). The RF controller 40 sets the determined PA drive voltage value to the PA drive power source circuit 32 (Operation S25). The PA drive power source circuit 32 performs the drive control of the amplifier 4.

The determining processing of the PA drive voltage in Operation S24 will be described with reference to FIG. 13.

The PA drive voltage determination is made based on the PAPR desired by the signal that is currently being transmitted and the PAPR that is set in advance. That is, by using the PA drive voltage control table 60 to obtain the drive voltage corresponding to the PAPR detected from the difference value Vdiff, the RF controller 40 determines whether or not the drive voltage has the optimum value with respect to the signal that is currently being transmitted. If the drive voltage does not have the optimum value, the RF controller 40 controls the drive voltage. The RF controller 40 performing the drive voltage control obtains the PAPR from the signal that is currently being transmitted and sends the optimum voltage to be applied to the amplifier to the PA drive power source circuit 32.

The RF controller 40 refers to the PA drive voltage control table 60 and detects the current PAPR that corresponds to the calculated difference value Vdiff (Operation S31). The RF controller 40 detects the target PA drive voltage with respect to the detected PAPR (Operation S32). The RF controller 40 determines whether the current PA drive voltage matches the target PA drive voltage or whether the current PA drive voltage is within a prescribed value range (Operation S33). If the current PA drive voltage matches the target PA drive voltage or if the current PA drive voltage is in the prescribed value range, the RF controller 40 continues monitoring the transmission signal after determining that the amplifier 4 performs the optimum amplification processing.

If the current PA drive voltage does not match the target PA drive voltage or has the value that exceeds a prescribed range, the RF controller 40 outputs an instruction for outputting the target PA drive voltage value to the PA drive power source circuit 32 (Operation S34).

As well as the drive voltage control of the amplifier 4, the transmission device 20 may perform APC control at the time of transmitting a large power.

According to the third embodiment, the transmission device 20 may simplify the detecting unit of the peak power value and the effective power value with respect to the amplified output signal. The transmission device 20 obtains the PAPR of the output signal based on the detected peak power value and the detected effective power value and performs the drive control of the amplifier in such a way that the saturation characteristic of the amplifier is the optimum value with respect to the PAPR. This may prevent the deterioration of the ACLR characteristic of the signal. The transmission device 20 performs the drive control of the amplifier based on the obtained PAPR. Therefore, the transmission device 20 may perform the control of the optimum power supply to the amplifier regardless of the signal type. Due to the optimization of the power supply, the transmission device 20 may extend the usage time of communication of a mobile terminal device or the like. Based on the effective power value with respect to the detected transmission signal, the transmission device 20 may perform the APC control of the transmission power.

[Fourth Embodiment]

Figure 14:
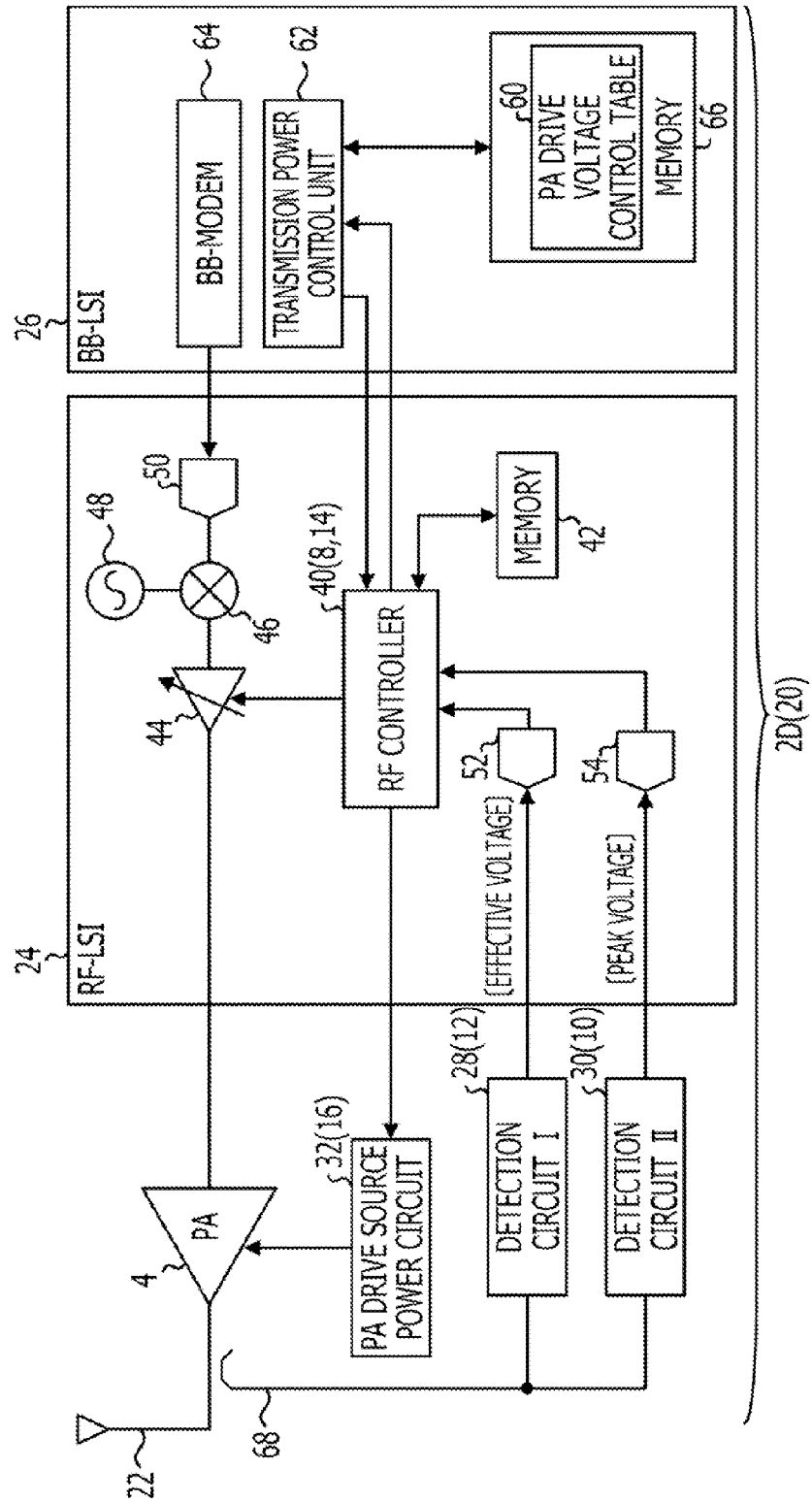
FIG. 14 is a diagram illustrating a configuration example of a transmission device according to a fourth embodiment.

A fourth embodiment will be described with reference to FIG. 14. FIG. 14 is a diagram illustrating a configuration example of a transmission device according to the fourth embodiment. The configuration illustrated in FIG. 14 is an example, and the present embodiment is not limited to the example.

The transmission device 20, which is an example of the disclosed transmission device, performs the drive control of the amplifier 4 by detecting the voltage by the detection circuit I 28 and the detection circuit II 30 with respect to the transmission signal that is power-amplified by the amplifier 4 and using the detection output. An amplifier circuit 2D of the transmission device 20 performs the amplification control of the amplifier 4 by using, for example, the BB-LSI 26 as well as the detection circuits 28 and 30 and the RF-LSI 24.

In the amplifying processing, for example, the effective voltage value Vrms detected by the detection circuit I 28 and the peak voltage value Vpk detected by the detection circuit II 30 are transmitted to the transmission power control unit 62 from the BF controller 40. The transmission power control unit 62 calculates the difference value Vdiff between the peak voltage value Vpk and the effective voltage value Vrms.

The memory 66 of the BB-LSI stores the above-described PA drive voltage control table 60. In the drive voltage control of the amplifier 4, for example, the transmission power control unit 62 reads out the PA drive voltage control table 60 from the memory 66 to detect the PAPR and determine the drive voltage.

The RF controller 40 outputs the control information such as the PA drive voltage value received from the transmission power control unit 62 to the PA drive power source circuit 32. As a result, the drive voltage is set in such a way that the saturation point of the amplifier 4 has the optimum value.

Here, descriptions and advantages of the first to fourth embodiments will be described below.

(1) The disclosed amplification device and the transmission device may estimate the PAPR of the transmission signal based on the difference between the peak value and the effective value of the power by combining the diode detection circuit detecting the effective power and the diode detection circuit detecting the peak power.

(2) The amplification device and the transmission device have a configuration in which the drive voltage of the PA is controlled to have the optimum value according to the PAPR obtained by the detection circuit.

(3) According to the amplification device, the control method for supplying the power to the amplifier circuit or the transmission device, the PAPR of the signal that is currently being transmitted may be obtained by a simple configuration. According to the amplification device, the control method for supplying the power to the amplifier circuit or the transmission device, the PA may be driven with the optimum voltage most of the time if not always based on the PAPR obtained from the detection result.

(4) The PAPR is correlated with the difference (ratio) between the effective power and the peak power of the transmission signal detected by the detecting unit. For example, a general diode detector may be used as the detecting unit. The properly designed diode detector may obtain a preferable detection characteristic even though the configuration is simple.

(5) The diode detector may obtain the voltage value that is proportional to the effective value by performing the envelope detection and smoothing the output signal. If the value of the resistance value R of the diode detection circuit is high, the detection output may not follow the envelope due to diagonal clipping distortion. As a result, the optimum detection output may not be obtained. However, the characteristic in this time may be considered to indicate behavior that is similar to the peak holding characteristic, so that the voltage that is proportional to the peak power value may be extracted. The above-described detection circuits may obtain the PAPR easily.

(6) To detect the PAPR, regarding the detection voltage (Vrms) corresponding to the detected effective value and the detection voltage (Vpk) that has the peak holding characteristic, for example, the RF controller performs the smoothing processing and obtains the difference value Vdiff. The desired difference value Vdiff is a value that is correlated with the PAPR of the signal. The RF controller 40 determines the drive voltage of the PA from the PA drive voltage control table stored in the memory based on the value of the difference value Vdiff.

(7) The amplifier circuit, the control method for supplying the power to the amplifier circuit, or the transmission device uses the detected effective power value use the detected effective power value, and the RF controller 40 may correct and adjust the output power of the transmission signal regarding the error of the output power.

(8) The PA drive power source circuit 32 controls the PA drive voltage by the control signal from the RF controller 40. The PA drive voltage is determined by the output power. In general, the voltage is suppressed a consuming power of the PA by reducing the voltage when the output power is low.

(9) Regarding transmission of the signals with the similar output power and different PAPRs, the drive voltage desired for the PA is increased to meet the ACLR characteristic if the PAPR of the signal is increased. The RF controller 40 obtains the optimum PA drive voltage based on the values of the transmission power and the PAPR and transmits the control signal to the PA drive power source control circuit. The amplifier circuit, the control method for supplying the power to the amplifier circuit, or the transmission device may control the drive voltage of the PA according to the PAPR of the transmission signal and control the power consumption of a case where the signal with a low PAPR is transmitted.

(10) The amplifier circuit, the control method for supplying the power to the amplifier circuit, or the transmission device may measure the PAPR of the transmission signal by a simple method without using a complicated processing circuit or expensive components. The amplifier circuit, the control method for supplying the power to the amplifier circuit, or the transmission device may optimize the drive voltage of the PA based on the measured PAPR and reduce the power consumption of a case where the signal is transmitted.

Figure 15:
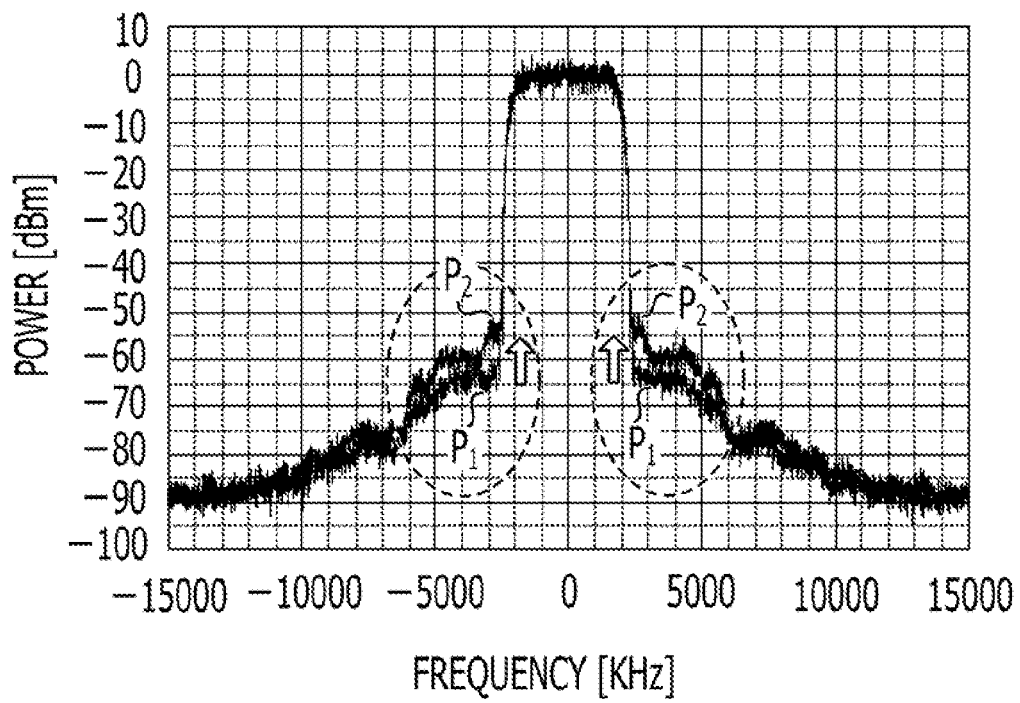
FIG. 15 is a diagram illustrating a difference of an ACLR in a case where a PAPR of the transmission signal is different.

The example of the change of the ACLR generated by the drive control of the amplifier will be described with reference to FIG. 15, FIG. 16, and FIG. 17. The configuration, the processing result, and the like illustrated in FIG. 15 and FIG. 17 are examples, and the present embodiment is not limited to the examples. In this case, ACLR is an abbreviation for Adjacent Channel Leakage power Ratio.

The power value illustrated in FIG. 15 indicates the difference of the ACLRs in a case of amplifying the signals with the similar power and different PAPRs. If the PAPR of the transmission signal is increased, the power value illustrated in FIG. 15 indicates the increase of a near-side power from $P_1$ to $P_2$. The increase of the near-side power indicates deterioration of the ACLR characteristic caused by the increase of the PAPR.

Figure 16:
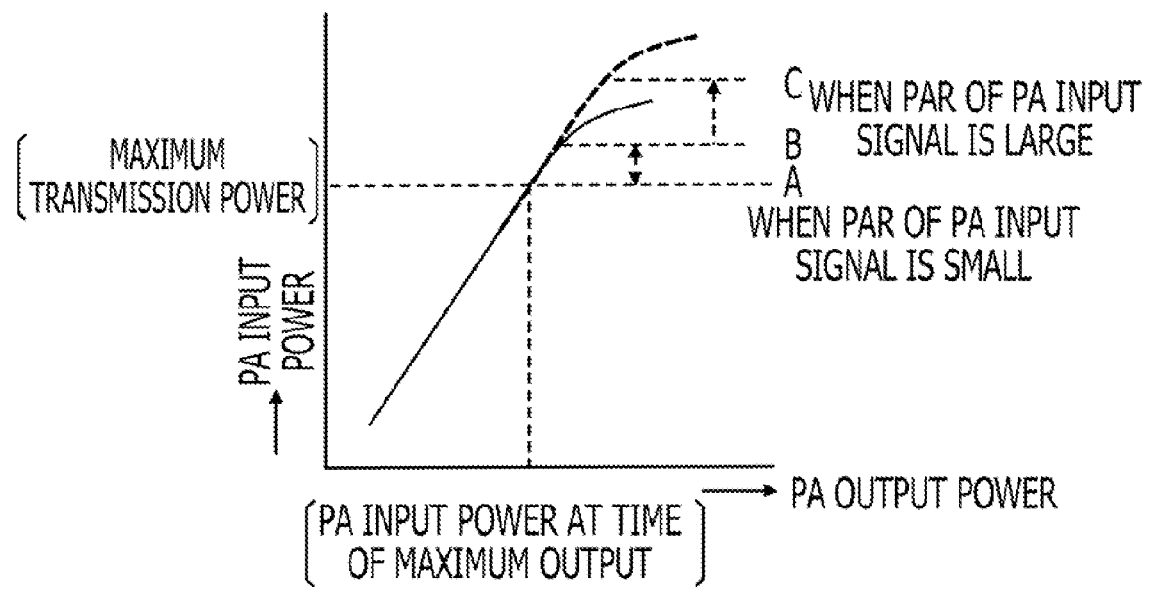
FIG. 16 is a diagram illustrating a saturation characteristic of an amplifier.
Figure 17:
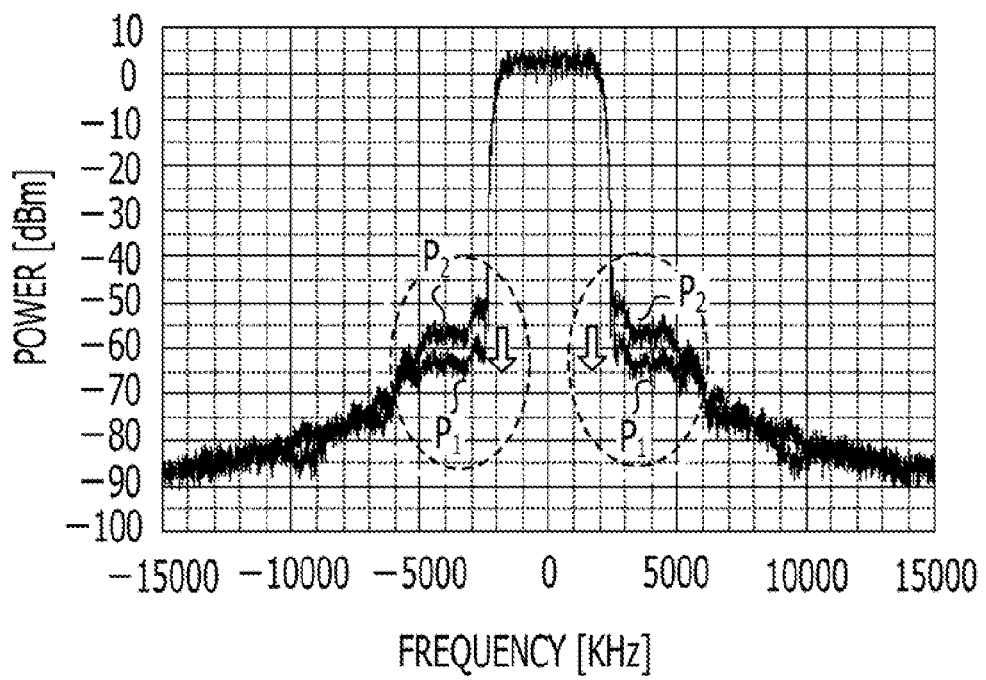
FIG. 17 is a diagram illustrating a difference of the ACLR in a case where a saturation point of the amplifier is changed.

FIG. 16 illustrates the output power characteristic with respect to the input power of a general amplifier. The PA input power at the time of the maximum output exists at the point A in the linear area. The saturation point with respect to the transmission power to the B point that is the maximum value of the linear area from the point A. As described above, since the current consumption is optimized by minimizing the power to be supplied to the amplifier, the saturation point of the amplifier 4 is set to the minimum amount at the time of the maximum output. The width between the point A and the point B depends on the PAPR of the signal generally handled by the amplifier. That is, if the signal with the similar power and the increased PAPR is amplified, the peak power of the signal to be input into the amplifier is increased. This causes deterioration of the ACLR characteristic as illustrated in FIG. 15. To avoid the deterioration of the ACLR characteristic, if the signal with the increased PAPR is amplified, the linear area is raised up to the point C, that is, the saturation point of the amplifier is increased as the PAPR is increased.

To transmit the transmission signal of the large PAPR, the transmission device may control the optimum drive voltage based on the PAPR by performing the amplification control illustrated in the above-described embodiment. If the saturation point of the amplifier is high, as illustrated in FIG. 17, the ACLR characteristic may be improved by reducing the power value from $P_2$ to $P_1$ regarding the 3-dimension distortion of the output power.

Deformation examples of each configuration according to other embodiments will be described below.

Figure 18:
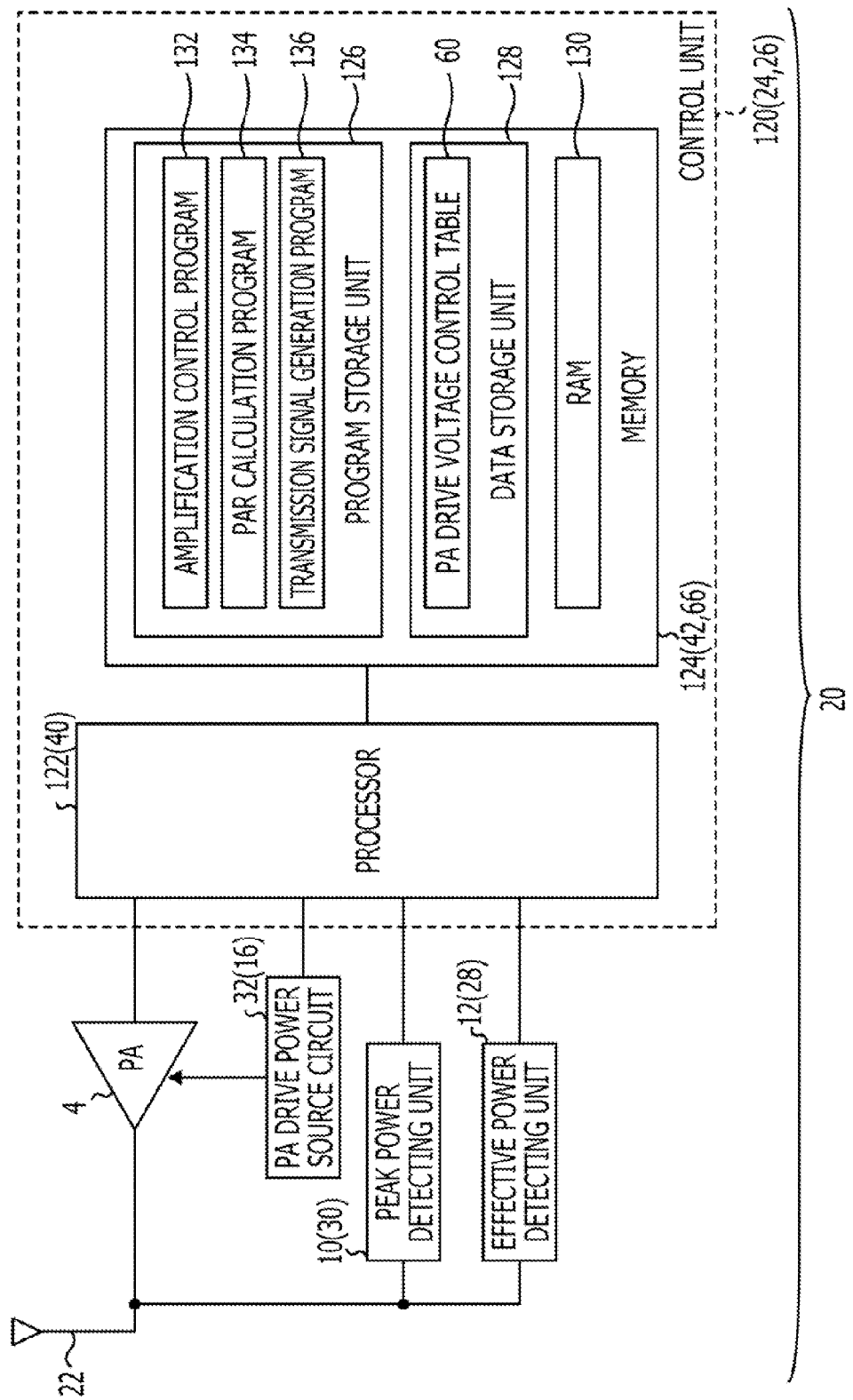
FIG. 18 is a diagram illustrating a configuration example of a control unit according to other embodiments.

(1) The drive control of the amplifier may be performed by the calculating processing by using a computer. For example, a control unit 120 may include a processor 122 and a memory 124 as illustrated in FIG. 18. The control unit 120 is an example of the operation control function unit of the transmission device 20 and is included in, for example, the RF-LSI 24 or the BB-LSI 26. The processor 122 is an example of the calculating processing unit and performs the calculating processing of the operation control program and the communication control program of the transmission device 20 stored in the memory 124, the control program of the amplifier 4, and the like. The processor 122 is included in, for example, the RF controller 40.

The memory 124 is an example of a storage unit of the transmission device 20 and may include, for example, a program storage unit 126, a data storage unit 128, and a Random Access Memory (RAM) 130. The program storage unit 126 stores, for example, an amplification control program 132 and a PAPR calculation program 134 as a program to be executed to perform the drive control of the amplifier 4. The program storage unit 126 stores, for example, a transmission signal generation program 136 as the program executed to perform the transmission control of the transmission device 20. The data storage unit 128 stores, for example, the PA drive voltage control table 60. The memory 124 may include, for example, a ROM, a flash memory, an Electrically Erasable and Programmable Read Only Memory (EEPROM) of which the content is electrically rewritten.

The program and data that perform the communication control and the amplification control of the transmission device 20, and the present embodiment is not limited to what stored in the program storage unit 126 or the data storage unit 128. For example, the program and the data stored in a computer-readable recording medium such as a magnetic disk, a flexible disk, an optical disk, an optical magnetic disk. Alternatively, the program and the like are read to be used from a server or a database on the network.

The RAM 130 is included in a work area in which the stored transmission control program, the amplification control program, and the like are executed.

If the processor 122 receives the detection result from the peak power detecting unit 10 or the effective power detecting unit 12 and executes the program stored in the program storage unit 126, the transmission device 20, which includes the control unit 120, calculates the difference value of the voltage value, detects the PAPR, and the like as described above. The transmission device 20 having the control unit 120 may detect the peak power value and the effective power value by a simple detecting unit. The transmission device 20 obtains the PAPR based on the peak power value and the effective power value to set the PA drive voltage value corresponding to the PAPR. With respect to the obtained PAPR, the transmission device 20 having the control unit 120 improves the saturation characteristic of the amplifier by performing the drive control of the amplifier so that the saturation point of the amplifier has the optimum value. This may prevent the ACLR characteristic of the signal from being deteriorated, so that the optimum power supply may be controlled regardless of the signal type. The transmission device 20 having the control unit 120 may extend the usage time of communication of a mobile terminal device or the like by optimizing the power supply.

Figure 19:
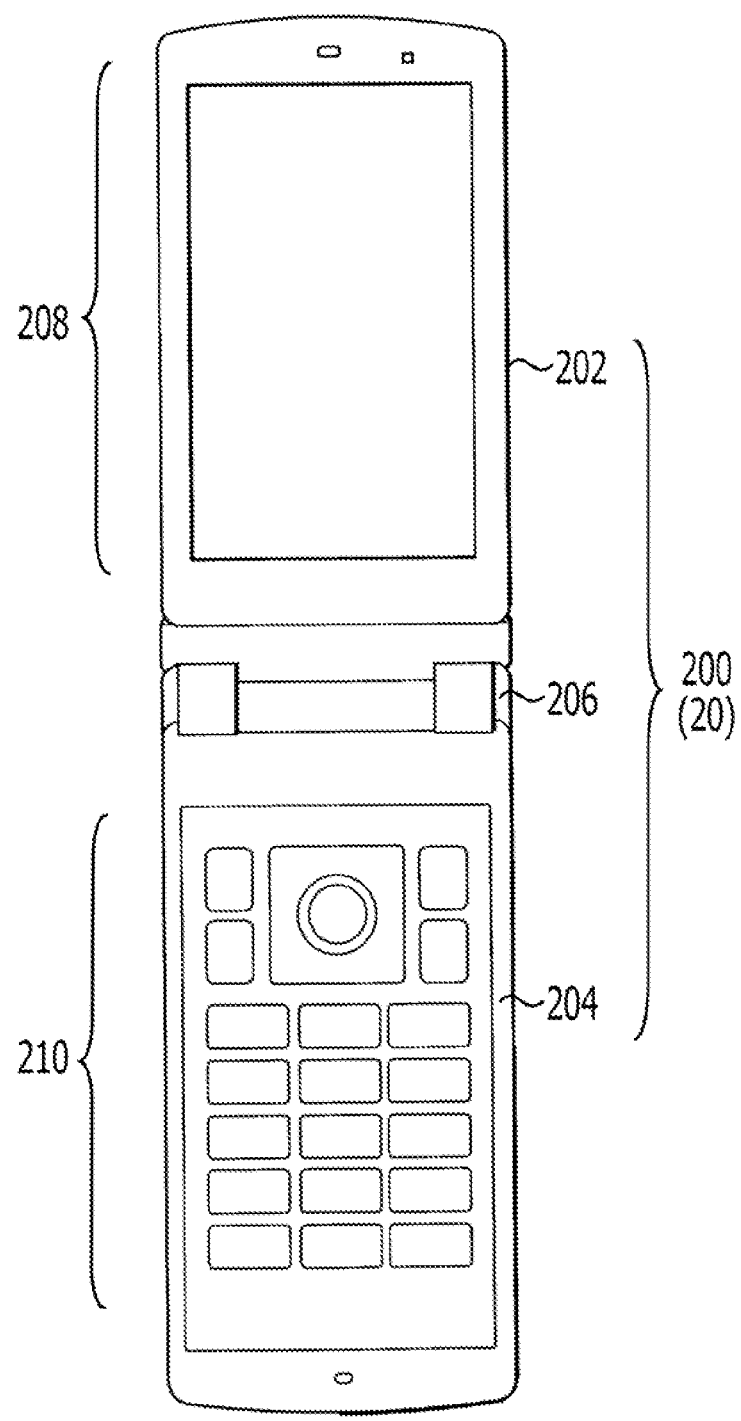
FIG. 19 is a diagram illustrating an external configuration example of a mobile phone device according to other embodiments.

(2) The above-described transmission device 20 may use, for example, a mobile phone 200 as an apparatus that may perform voice communication and data transmission/reception. As illustrated in FIG. 19, the mobile phone 200 is configured to be opened and closed by coupling a first housing unit 202 and a second housing unit 204 with a hinge unit 206. The first housing unit 202 includes, for example, a display unit 208. The second housing unit 204 includes an operation unit 210 such as a cursor key and a keyboard. Moreover, the second housing unit 204 includes a microphone and a receiver to perform the voice communication.

Figure 20:
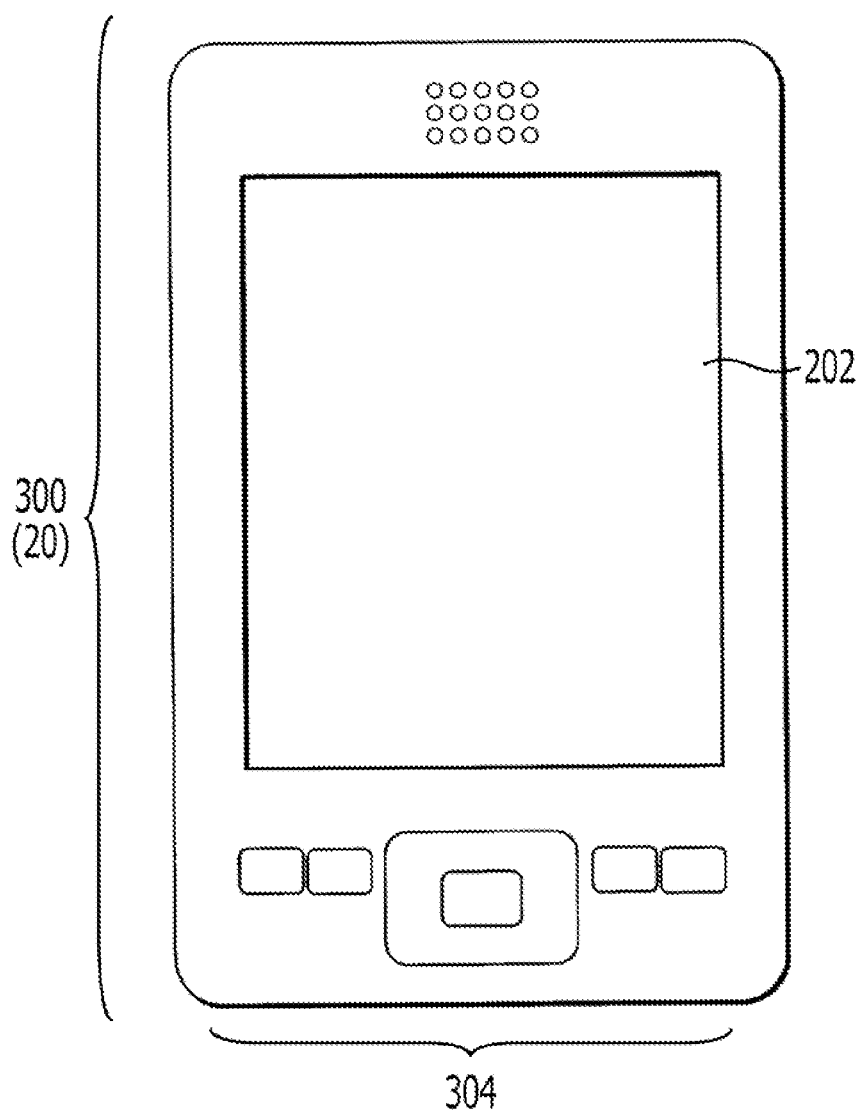
FIG. 20 is a diagram illustrating another external configuration example of the mobile phone device according to other embodiments.

(3) As illustrated in FIG. 20, as another example of the apparatus included in the transmission device 20, a Personal Digital Assistant (PDA) 300 may be used. The PDA 300 includes the display unit 302 and the operation unit 304. As another example of the apparatus included in the transmission device 20, for example, a Personal Computer (PC) and the like may be used.

(4) According to the above-described embodiment, to detect the peak power and the effective power of the transmission signal, the voltage values are detected, and the control is performed by correlating the difference of the voltage values with the drive voltage value of the PAPR and the PA. The present embodiment is not limited to this detection. For example, the current value is detected, and the control may be performed based on the detected current value.

(5) According to the above-described embodiment, regarding the drive control of the amplifier 4, the drive voltage is controlled. The drive control is not limited to the drive control. For example, the amplification control of the amplifier may be performed with the current value as a standard.

(6) According to the above-described embodiment, in the PA drive voltage control table 60 used for the drive control of the amplifier, the calculated difference value between the voltage values is correlated with the PAPR, and the PAPR is correlated with the PA drive voltage value. However, the present embodiment is not limited to the correlations. For example, the difference value may be directly correlated with the PA drive voltage value.

(7) The number of the coupler 68 that extracts the output signal (transmission signal) from the amplifier is not limited to one. For example, a plurality of couplers 68 may be provided in each band of the transmission signal.

Figure 21:
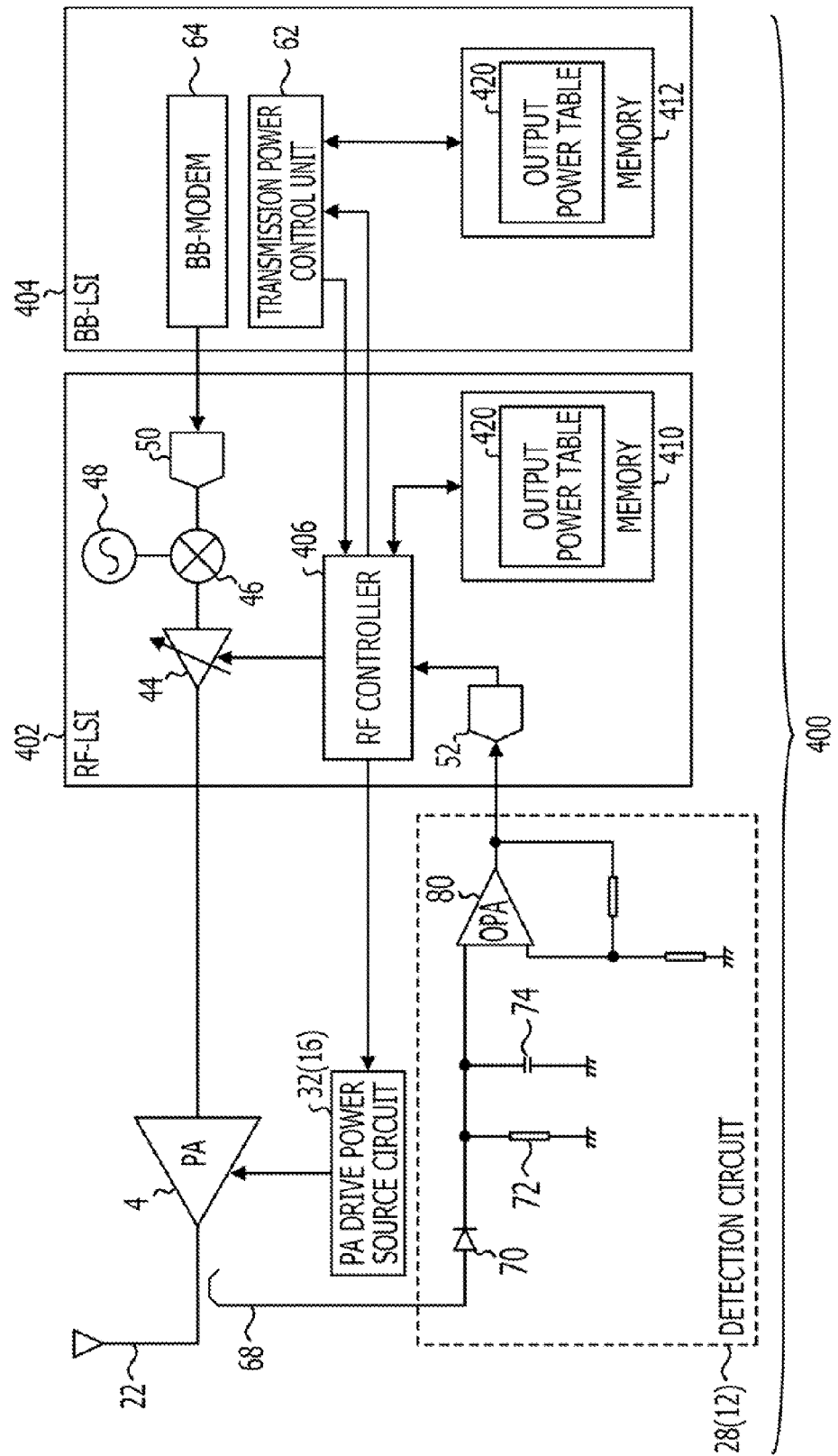
FIG. 21 is a diagram illustrating an example of the amplifier circuit.
Figure 22:
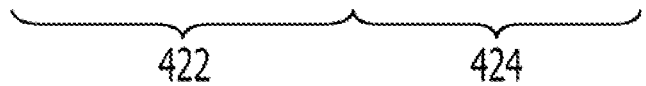
FIG. 22 is a diagram illustrating an example of an output power table.

The power detection of the transmission signal and the drive control of the amplifier will be described with reference to FIG. 21 and FIG. 22. FIG. 21 is a diagram illustrating an example of the amplifier circuit. FIG. 22 is a diagram illustrating an example of the output power table.

A transmission device 400 illustrated in FIG. 21 extracts part of the transmission output amplified by the amplifier 4 by using the coupler 68. After performing the diode detection, the detection circuit 28 obtains the detection voltage that is converted into the optimum amplitude by the operational amplifier 80. The detection information obtained from the detection voltage includes simply the effective value of the output power. The detection circuit 28, which detects the above-described transmission power, corrects an output power error caused by gain variation due to temperature variation and by the non-linearity of the PA in the area in which the transmission power is mainly high.

The RF controller 406 mounted on an RF-LSI 402 previously sets the relation between the output power 424 and the detection voltage 422 in a memory 410 as an output power table 420 illustrated in FIG. 22 and obtains the power that is currently being transmitted based on the measured detection voltage. If the desired power is different from the set transmission power, the RF controller 406 performs the control in such a way that a correct transmission power is obtained by correcting the transmission power control.

The RF controller 406 may transmit the detection information to a BB-LSI 404 and calculate a correction value in the BB-LSI 404. A memory 412 in the BB-LSI 404 includes the output power table 420 in which the output power is correlated with the detection voltage.

The PA drive voltage control is performed to reduce the current consumption of the amplifier 4 in an area where the transmission power is mainly low. The transmission power control unit 62 of the RF controller 406 and the BB-LSI 404 sends an instruction to the PA drive power source circuit 32 so that the PA drive voltage is reduced when the transmission power is low. If the transmission signal types are different from each other as in the regular voice communication and the HSUPA communication. That is, the PAPRs of the transmission signal are different from each other, the transmission power control unit 62 of the RF controller 406 and the BB-LSI 404 varies the PA drive voltage so that the ACLR characteristic is not deteriorated.

The PA drive voltage control is performed to

The above-described conventional power detection detects simply the effective power. Thus, the amplifier 4 performs the drive voltage control based on the value set according to the output power level that is set in advance or the transmission signal type. That is, when the conventional transmission device performs the voltage control of the PA according to the transmission signal, the drive voltage of the amplifier 4 is set according to the maximum PAPR because the PAPR varies depending on a signal condition even if the signal types such as the HSDPA, the HSUPA, and the LTE are similar.

As a result, since the drive voltage is not optimized most of the time if not always by monitoring the PAPR of the signal that is currently being transmitted, there are many cases in which the operation is performed with the voltage that is higher than necessary with respect to the PAPR of the signal that is actually being transmitted. Thus, the conventional transmission device is desired to shorten the communication time as the power consumption is increased. Although there is a method such as envelope tracking for varying the drive voltage of the amplifier 4 according to a state of the transmission signal, the conventional transmission device is desired to have a large calculation circuit, and the followability with respect to the modulation signal in a broadband such as an LTE is desired to be improved.

It is obvious that the above-described inconvenience is solved in the above-described embodiments.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifier circuit comprising:
   an amplifier;
   a first detecting circuit configured to detect a peak power output from the amplifier;
   a second detecting circuit configured to detect an effective power output from the amplifier;
   a control circuit configured to obtain Peak-to-Average Power Ratios (PAPRs) by calculating the difference value between detected peak power and detected effective power; and
   a memory configured to store the PAPRs and corresponding drive voltage values of the amplifier, wherein
   the control circuit is further configured to select a drive voltage of the amplifier from the memory and control the drive voltage of the amplifier in such a way that a saturation point of the amplifier has an optimum with respect to the corresponding PAPR.

2. The amplifier circuit according to claim 1, wherein the control circuit is further configured to control the amplifier according to the PAPR obtained based on an output power from the amplifier.

3. The amplifier circuit according to claim 1, wherein the first detecting circuit comprises a diode detection circuit in which a constant time is set to perform an envelope detection on the output from the amplifier, and wherein the second detecting circuit comprises a diode detection circuit in which the constant time is set to perform peak holding detection on the output from the amplifier.

4. A method for controlling power supply to an amplifier circuit, comprising:

detecting a peak power output from the amplifier;

detecting an effective power output from the amplifier;

obtaining Peak-to-Average Power Ratios (PAPRs) by calculating the difference value between detected peak power and detected effective power;

storing, in memory, the PAPRs;

selecting a drive voltage of the amplifier from the memory; and controlling the drive voltage of the amplifier in such a way that a saturation point of the amplifier has an optimum value with respect to corresponding PAPR.

5. A transmission device, comprising:

an amplifier;

a first detecting circuit configured to detect a peak power output from the amplifier;

a second detecting circuit configured to detect an effective power output from the amplifier;

a control circuit configured to obtain Peak-to-Average Power Ratios (PAPRs) by calculating the difference value between detected peak power and detected effective power; and a memory configured to store the PAPRs and corresponding drive voltage values of the amplifier, wherein the control circuit is further configured to select a drive voltage of the amplifier from the memory and control the drive voltage of the amplifier in such a way that a saturation point of the amplifier has an optimum with respect to the corresponding PAPR.

6. The transmission device according to claim 5, wherein the control circuit is further configured to control the amplifier according to the PAPR obtained from the transmission output from the amplifier.

7. The transmission device according to claim 5, wherein the first detecting circuit comprises a diode detection circuit in which a time constant for performing envelope detection with respect to the output of the amplifier is set, and wherein the second detecting circuit comprises a diode detection circuit in which the time constant for performing peak holding characteristic detection with respect to the output from the amplifier.

* * * * *